(12) United States Patent
Boettiger et al.

(10) Patent No.: US 10,854,665 B2
(45) Date of Patent: Dec. 1, 2020

(54) SEMICONDUCTOR DEVICE AND METHOD OF FORMING CURVED IMAGE SENSOR REGION ROBUST AGAINST BUCKLING

(71) Applicant: SEMICONDUCTOR COMPONENTS INDUSTRIES, LLC, Phoenix, AZ (US)

(72) Inventors: Ulrich Boettiger, Garden City, ID (US); Marc Allen Sulfridge, Boise, ID (US); Andrew Eugene Perkins, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/038,422

(22) Filed: Jul. 18, 2018

(65) Prior Publication Data
US 2018/0331150 A1 Nov. 15, 2018

Related U.S. Application Data

(62) Division of application No. 15/258,783, filed on Sep. 7, 2016, now Pat. No. 10,056,428.

(51) Int. Cl.
*H01L 27/146* (2006.01)
*H01L 27/148* (2006.01)

(52) U.S. Cl.
CPC .. *H01L 27/14687* (2013.01); *H01L 27/14607* (2013.01); *H01L 27/14632* (2013.01); *H01L 27/14806* (2013.01)

(58) Field of Classification Search
None
See application file for complete search history.

(56) References Cited

U.S. PATENT DOCUMENTS

| | | | | |
|---|---|---|---|---|
| 8,288,203 B2* | 10/2012 | Cho | ........................ | H01L 24/19 438/107 |
| 8,384,231 B2* | 2/2013 | Grivna | .................... | H01L 21/78 257/787 |

(Continued)

OTHER PUBLICATIONS

Sulfridge et al., "Methods of Forming Curved Image Sensors," U.S. Appl. No. 14/667,457, filed Mar. 24, 2015, 22 pages.

*Primary Examiner* — Long Pham
(74) *Attorney, Agent, or Firm* — Adam R. Stephenson, Ltd.

(57) ABSTRACT

A semiconductor wafer has a plurality of non-rectangular semiconductor die with an image sensor region. The non-rectangular semiconductor die has a circular, elliptical, and shape with non-linear side edges form factor. The semiconductor wafer is singulated with plasma etching to separate the non-rectangular semiconductor die. A curved surface is formed in the image sensor region of the non-rectangular semiconductor die. The non-rectangular form factor effectively removes a portion of the base substrate material in a peripheral region of the semiconductor die to reduce stress concentration areas and neutralize buckling in the curved surface of the image sensor region. A plurality of openings or perforations can be formed in a peripheral region of a rectangular or non-rectangular semiconductor die to reduce stress concentration areas and neutralize buckling. A second semiconductor die can be formed in an area of the semiconductor wafer between the non-rectangular semiconductor die.

20 Claims, 9 Drawing Sheets

(56) References Cited

U.S. PATENT DOCUMENTS

| | | | |
|---|---|---|---|
| 8,416,498 B2* | 4/2013 | Sakaki | B29C 33/3878 |
| | | | 359/619 |
| 9,117,868 B1 | 8/2015 | Nangoy | |
| 9,761,619 B2* | 9/2017 | Kim | H01L 27/1469 |
| 2013/0249079 A1* | 9/2013 | Lee | H01L 29/0657 |
| | | | 257/737 |
| 2015/0330915 A1* | 11/2015 | Jin | G01N 23/225 |
| | | | 378/62 |
| 2016/0343800 A1* | 11/2016 | Grivna | H01L 29/06 |
| 2018/0069049 A1* | 3/2018 | Boettiger | H01L 27/14687 |

* cited by examiner

SEMICONDUCTOR DEVICE AND METHOD OF FORMING CURVED IMAGE SENSOR REGION ROBUST AGAINST BUCKLING

CLAIM TO DOMESTIC PRIORITY

The present application is a division of U.S. patent application Ser. No. 15/258,783, filed Sep. 7, 2016, which application is incorporated herein by reference.

FIELD OF THE INVENTION

The present invention relates in general to semiconductor devices and, more particularly, to a semiconductor die and method of forming a curved image sensor region robust against buckling.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontroller, image sensor, application specific integrated circuits (ASIC), power conversion, standard logic, amplifier, clock management, memory, interface circuit, and other signal processing circuits.

An image sensor is a type of semiconductor device that detects and records an image by converting light or electromagnetic radiation into electric signals. An image sensor can be implemented with semiconductor charge-coupled devices (CCD) and active pixel sensors in complementary metal-oxide-semiconductor (CMOS) or N-type metal-oxide-semiconductor (NMOS) technologies with applications in digital cameras, video recorders, medical imaging equipment, night vision equipment, thermal imaging devices, radar, sonar, and other image detecting devices.

Light from the image scene is typically focused onto a flat or planar image sensor surface through one or more optical lenses, e.g., up to four or more lenses. The optical focusing lenses add cost, complexity, and height to the camera package. Even with optical lenses, image quality is often better in the center region and less on the edges of the image sensor. Image sensors are continually driving towards higher resolution, faster focus times, better focus depth, lower profile, and lower cost.

One approach to reducing the number of optical focusing lenses is to make the image sensor with a curved surface. A camera using a curved image sensor is known to have certain performance advantages over one with a flat image sensor, for example in mobile digital camera applications.

FIG. 1 shows semiconductor wafer 10 with base substrate material 12. A plurality of semiconductor die 14 is formed on wafer 10 separated by an inter-die wafer area or saw street 16. Semiconductor die 14 contains an image sensor region, as described above. Semiconductor die 14 has a rectangular or square form-factor with linear side edges 20 and corners 22 and a flat surface. Semiconductor wafer 10 is typically reduced in thickness and singulated through saw street 16 into individual thin semiconductor die 14.

The thin rectangular semiconductor die 14 with a flat surface is placed over a mold or substrate with a curved or concave recess. The surface of the thin semiconductor die 14 is deflected by air pressure or other forces into the concave recess of the mold to form a curved image sensor region 32, as shown in FIGS. 2a and 2b.

A rectangular form factor of semiconductor die 14 does not readily fit into a curved recess. The additional surface area of the rectangular die form factor over the curved recess creates stress concentration areas. The rectangular image sensor die 14 is subjected to stress when forced into the curved recess of the mold. The stress concentration areas can cause out-of-plane deformation or buckling, as shown in area 34 of image sensor region 32, as shown in FIG. 2a. FIG. 2b shows another example of buckling in area 36 of image sensor region 32. The buckling is dependent on die form factor, die size, die thickness, loading, and ratio of die width to radius of curvature. A rectangular semiconductor die does not readily conform to a concave recess. A smaller die with smaller radius of curvature is more susceptible to buckling. Mechanical instability where compressive forces exceed stiffness of the base substrate material can lead to buckling. In some cases, semiconductor die 14 with image sensor region 32 is susceptible to sensor cracking and other manufacturing defects.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 3A:
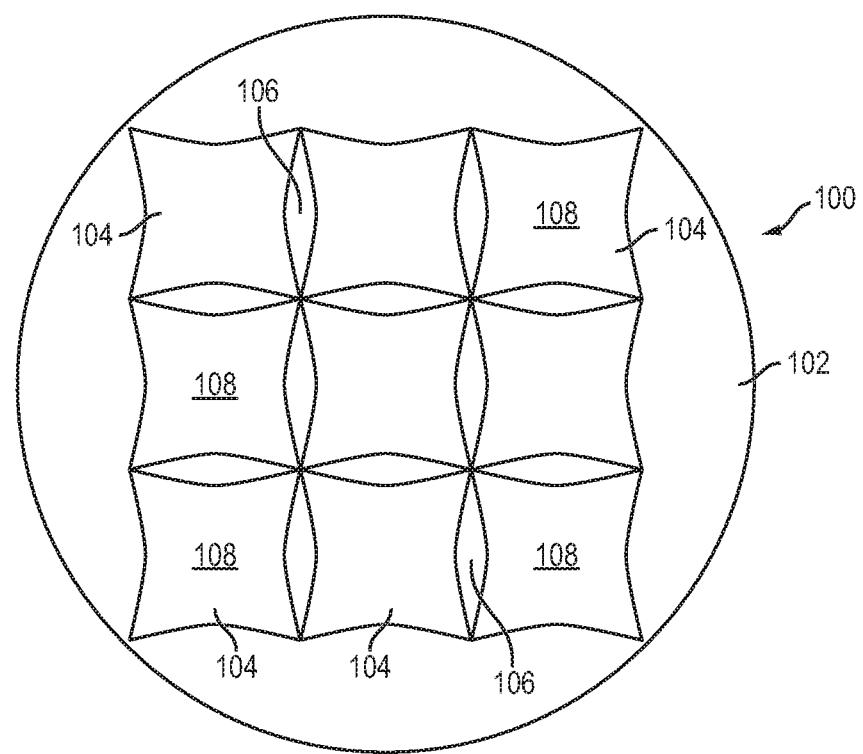
FIGS. 3a-3d illustrate various embodiments of a semiconductor wafer with a plurality of non-rectangular, circular, and elliptical semiconductor die.

FIG. 3a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by inter-die wafer area 106. In particular, semiconductor die 104 have a non-rectangular form factor and are arranged in a pattern to maximize the number of die on the wafer and optimize wafer layout efficiency. For example, semiconductor wafer 100 with semiconductor die 104 having a non-rectangular form factor provides a wafer area utilization of about 85%. Each semiconductor die 104 has an active surface containing an image sensor region 108 implemented as CCD or active pixel sensors in CMOS or NMOS. In one embodiment, semiconductor wafer 100 has a width or diameter of 100-450 millimeters (mm) and thickness of 675-775 micrometers (m). In another embodiment, semiconductor wafer 100 has a width or diameter of 150-300 mm.

Figure 3B:
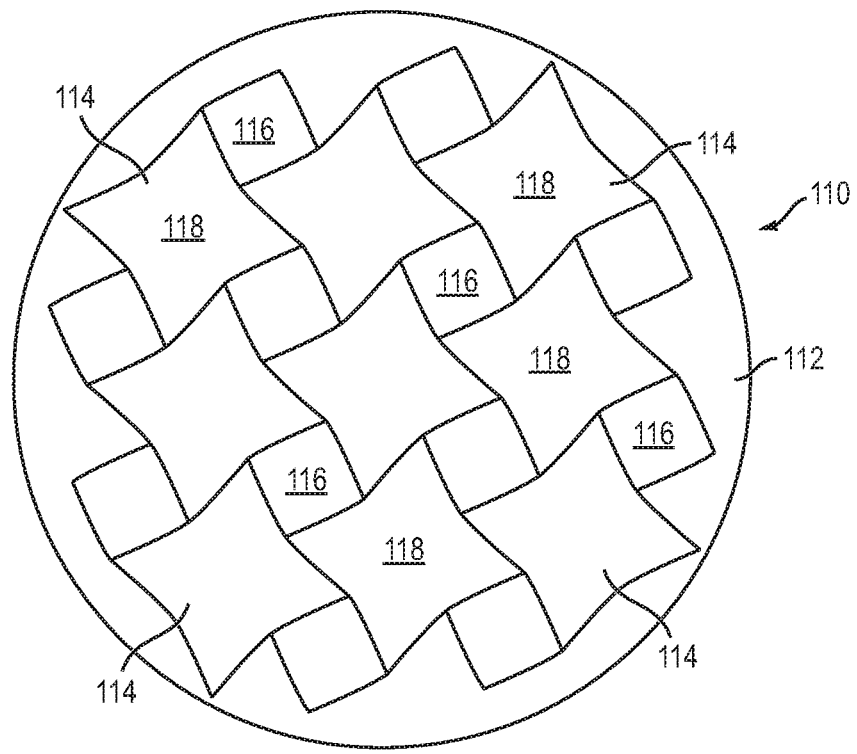

FIG. 3b shows semiconductor wafer 110, with similar materials and dimensions as semiconductor wafer 100, with a base substrate material 112. A plurality of semiconductor die 114 is formed on wafer 110. A wafer area 116 is shown between and adjacent to semiconductor die 114 for other utilization. In particular, semiconductor die 114 have a non-rectangular form factor and are arranged in a pattern to maximize the number of die on the wafer and optimize wafer layout efficiency. For example, semiconductor wafer 110 with semiconductor die 114 having a non-rectangular form factor and wafer area 116 provides a wafer area utilization of about 99.5%. Each semiconductor die 114 has an active surface containing an image sensor region 118 implemented as CCD or active pixel sensors in CMOS or NMOS.

Figure 3C:
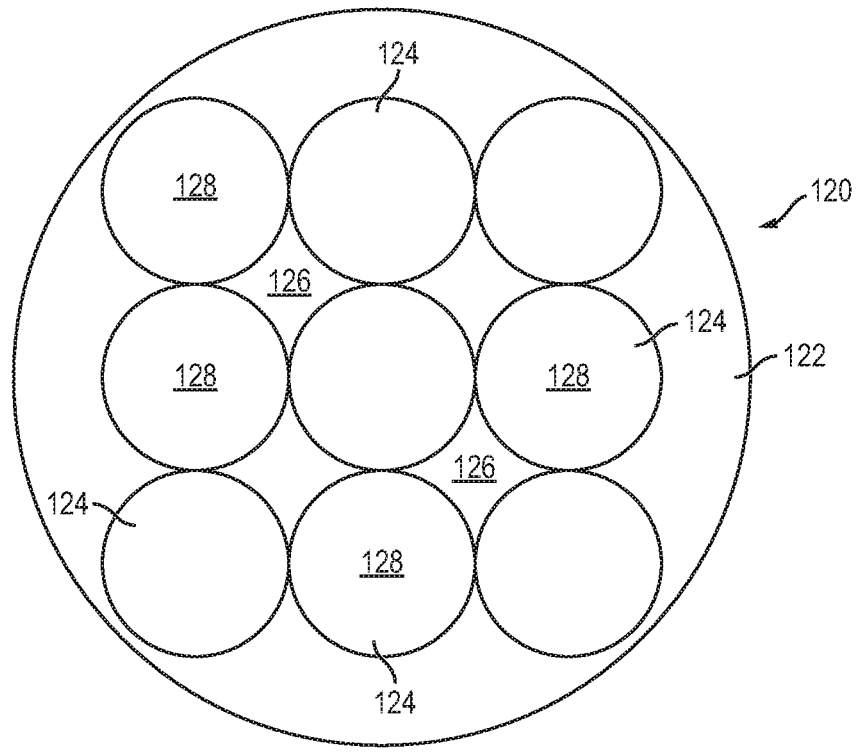

FIG. 3c shows semiconductor wafer 120, with similar materials and dimensions as semiconductor wafer 100, with a base substrate material 122. A plurality of semiconductor die 124 is formed on wafer 120 separated by an inter-die wafer area 126. In particular, semiconductor die 124 have a circular or elliptical form factor and are arranged in a pattern to maximize the number of die on the wafer and optimize wafer layout efficiency. For example, semiconductor wafer 120 with semiconductor die 124 having a circular form factor provides a wafer area utilization of about 82.7%. Each semiconductor die 124 has an active surface containing an image sensor region 128 implemented as CCD or active pixel sensors in CMOS or NMOS.

Figure 3D:
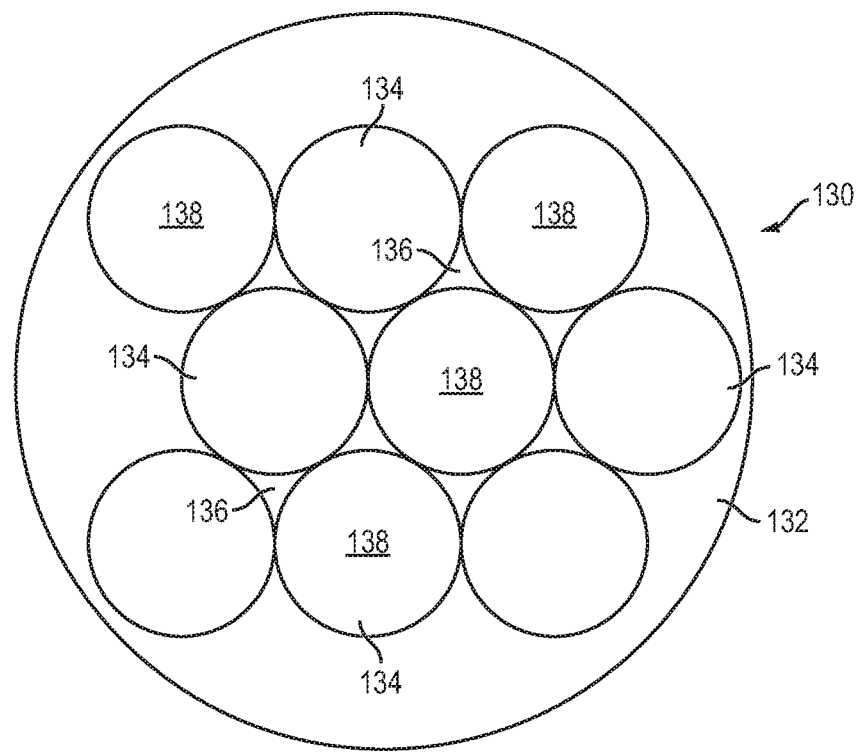

FIG. 3d shows semiconductor wafer 130, with similar materials and dimensions as semiconductor wafer 100, with a base substrate material 132. A plurality of semiconductor die 134 is formed on wafer 130 separated by an inter-die wafer area 136. In particular, semiconductor die 134 have a circular or elliptical form factor and are arranged in a pattern to maximize the number of die on the wafer and optimize wafer layout efficiency. Each semiconductor die 134 has an active surface containing an image sensor region 138 implemented as CCD or active pixel sensors in CMOS or NMOS.

Figure 4A:
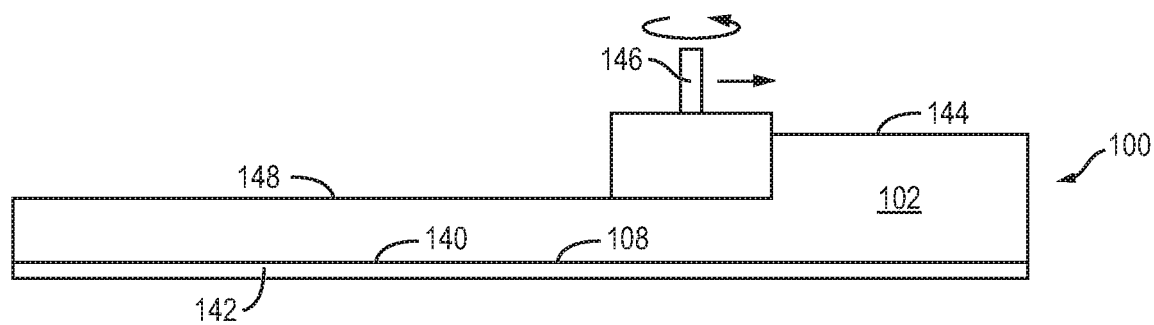
FIGS. 4a-4e illustrate the semiconductor die with non-rectangular form factors singulated from the wafers of FIGS. 3a-3d.

In FIG. 4a, semiconductor wafer 100 is inverted and mounted with active surface 140 oriented to backgrinding tape 142. Active surface 140 contains image sensor region 108. Back surface 144 undergoes a backgrinding operation with grinder or grinding wheel 146 to remove a portion of base substrate material 102 down to surface 148. Semiconductor wafer 100 has a post-grinding thickness of 10-50 µm. Semiconductor wafer 100 is singulated into individual semiconductor die 104. Given the non-rectangular form factor of semiconductor die 104 and asymmetric inter-die wafer area 106, a lithographic patterning step followed by a plasma etch or plasma dicing is used to singulate semiconductor wafer 100 along the side edges of each die. A similar back-grind and singulation is performed on semiconductor wafers 110, 120, and 130.

Figure 1:
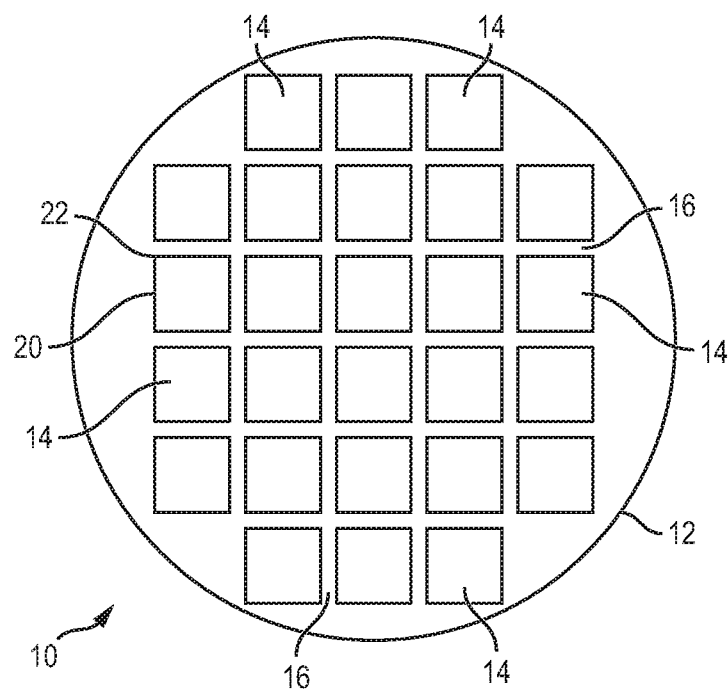
FIG. 1 illustrates a known semiconductor wafer with rectangular die.
Figure 2A:
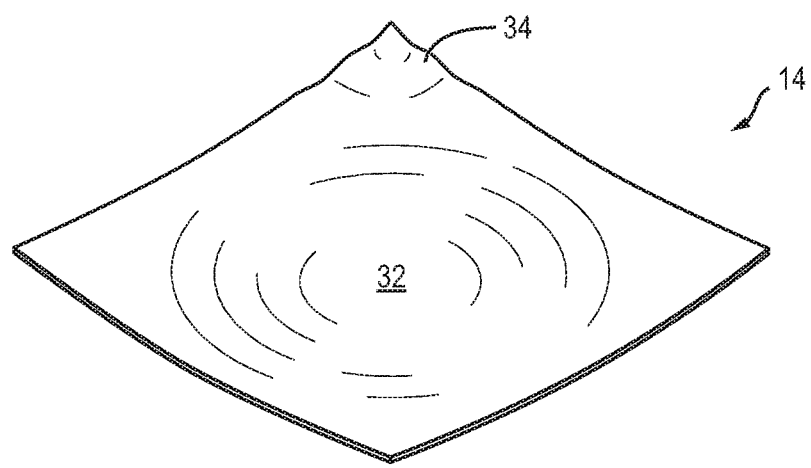
FIGS. 2a-2b illustrate buckling in a curved image sensor die.
Figure 2B:
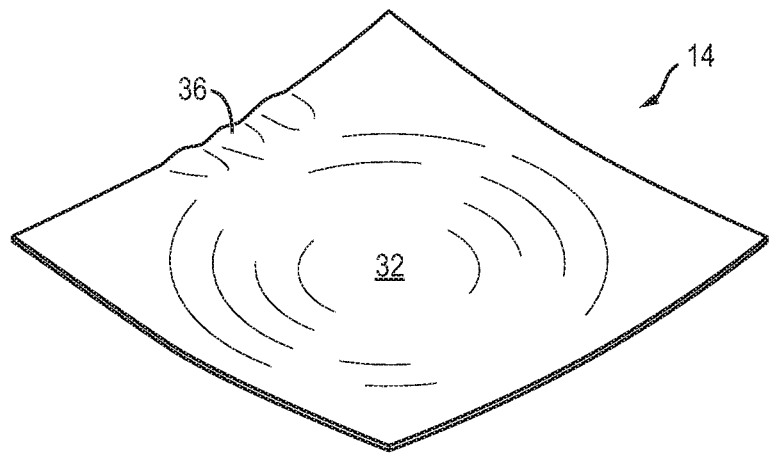
Figure 4B:
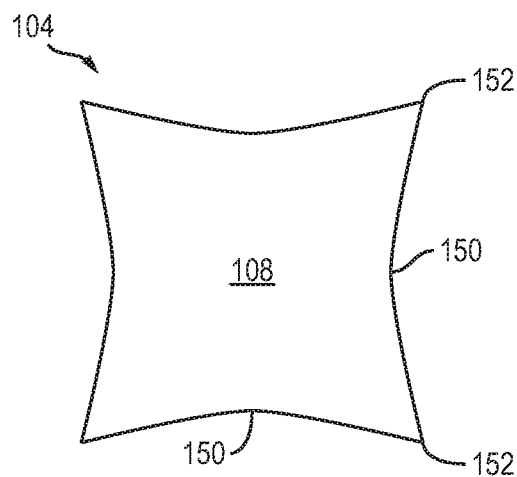

FIG. 4b shows the thin semiconductor die 104 post singulation. Semiconductor die 104 has a non-rectangular form factor, e.g., shape with non-linear edges 150 on four sides between corners 152 around image sensor region 108. In particular, non-linear side edges 150 concave into image sensor region 108. With the non-rectangular form factor and non-linear concave side edges 150, there is less base substrate material 102 between corners 152 than would be found in the linear side edges 20 between corners 22 of the rectangular die 14 of FIG. 1. Semiconductor die 114 singulated from semiconductor wafer 110 has similar features as semiconductor die 104.

Figure 4C:
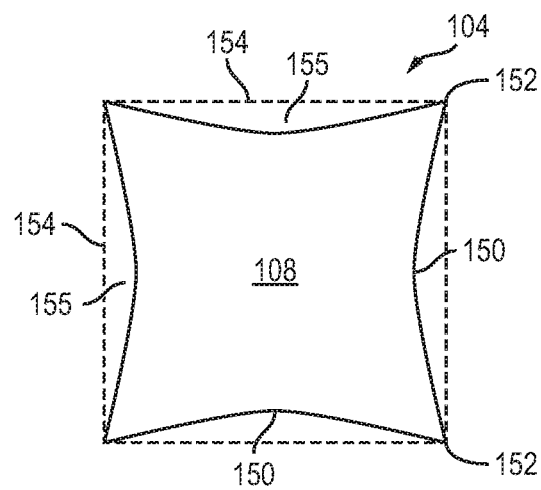

FIG. 4c further illustrates the difference between non-rectangular semiconductor die 104 and rectangular semiconductor die 14. Dotted lines 154 illustrate additional base substrate material 155 that would be present with linear side edges 20 between corners 22 of the rectangular die 14 of FIG. 1. The non-rectangular form factor of semiconductor die 104 eliminates or removes base substrate material 155 within dotted lines 154 in a peripheral region of semiconductor die 104.

Figure 4D:
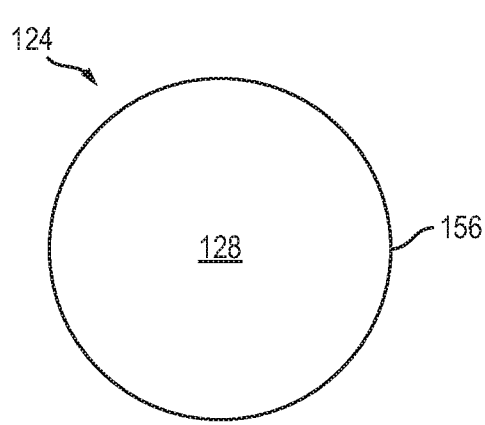

FIG. 4d shows the thin semiconductor die 124 post singulation. Semiconductor die 124 has a circular or elliptical form factor with round side edge 156 around image sensor region 128. With the circular or elliptical form factor and round side edge 156, there is less base substrate material 122 than would be found in linear side edges 20 between corners 22 of the rectangular die 14 of FIG. 1. Semiconductor die 134 singulated from semiconductor wafer 130 has similar features as semiconductor die 124.

Figure 4E:
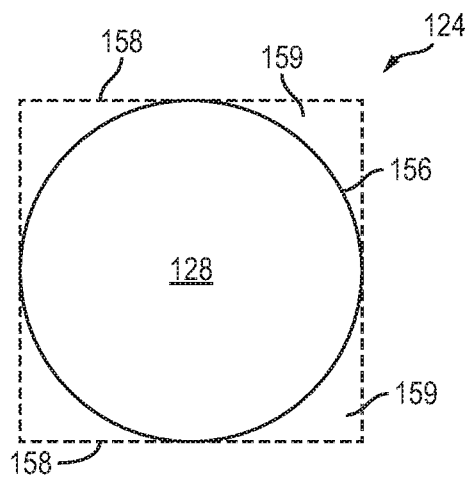

FIG. 4e further illustrates the difference between circular semiconductor die 124 and rectangular semiconductor die 14. Dotted lines 158 illustrate additional base substrate material 159 that would be present with linear side edges 20 between corners 22 of the rectangular die 14 of FIG. 1. The circular form factor of semiconductor die 124 eliminates or removes base substrate material 159 within dotted lines 158 in a peripheral region of semiconductor die 124.

Figure 5A:
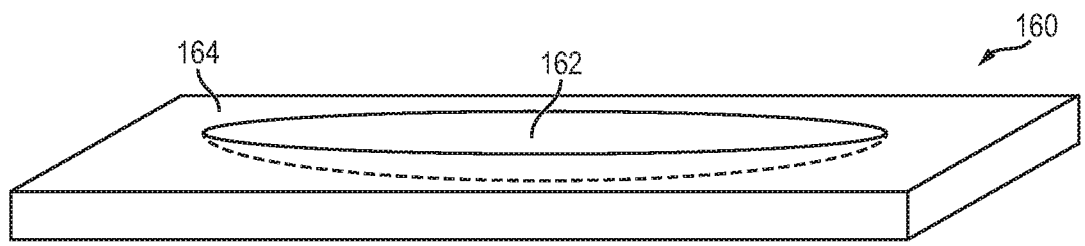
FIGS. 5a-5c illustrate a process of forming a curved or concave image sensor region with a mold having a curved surface.
Figure 5B:
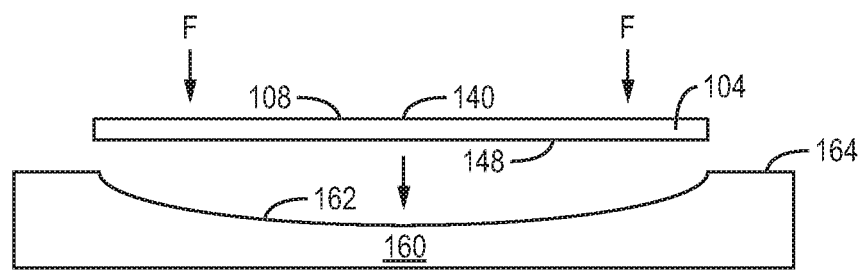
Figure 5C:
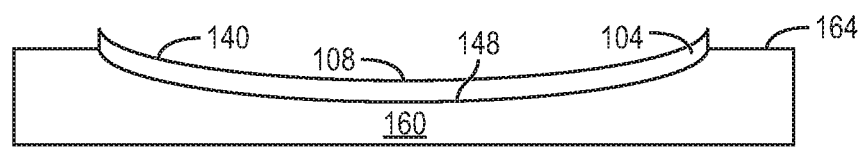

FIG. 5a shows mold or substrate 160 with curved or concave recess 162 in surface 164. In FIG. 5b, the thin semiconductor die 104 is positioned over mold 160 with surface 148 oriented to recess 162. In FIG. 5c, surface 148 of semiconductor die 104 is brought into contact with surface 164 of mold 160. Active surface 140 is deflected by air pressure, hydrostatic pressure, or other forces F, if desired under an elevated temperature, into concave recess 162 to form a curved or concave image sensor region 108 in semiconductor die 104.

Figure 6A:
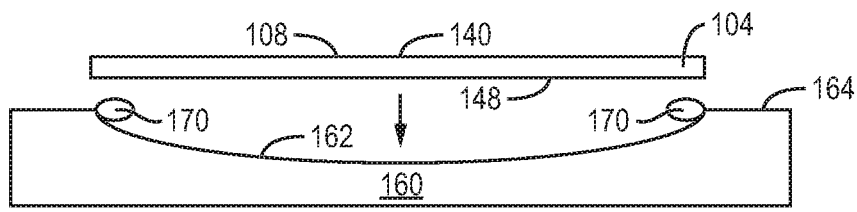
FIGS. 6a-6c illustrate another process of forming the concave image sensor region with a mold having a curved surface.
Figure 6B:
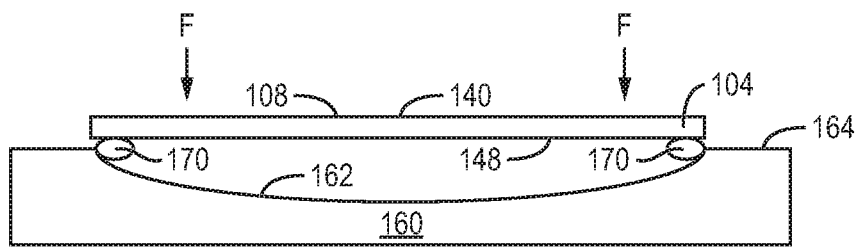
Figure 6C:
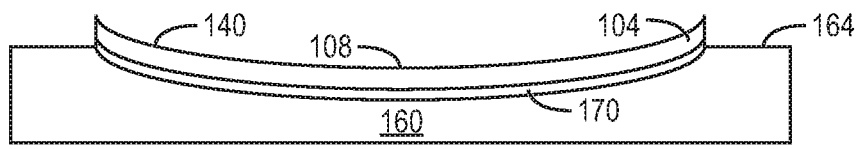

In another embodiment, the thin semiconductor die 104 is positioned over mold 160 with surface 148 oriented to recess 162. An epoxy 170 is disposed around curved recess 162. In FIG. 6b, surface 148 of semiconductor die 104 is brought into contact with epoxy 170 and surface 164 of mold 160. In FIG. 6c, active surface 140 is deflected by air pressure, hydrostatic pressure, or other forces F, if desired under an elevated temperature, into concave recess 162 to form a curved or concave image sensor region 108 in semiconductor die 104. Epoxy 170 uniformly disperses to cover surface 148 within concave recess 162. A similar process as described in FIGS. 5a-5c and 6a-6c is used to form a curved or concave image sensor regions 118, 128, and 138 in semiconductor die 114, 124, and 134, respectively.

Figure 7A:
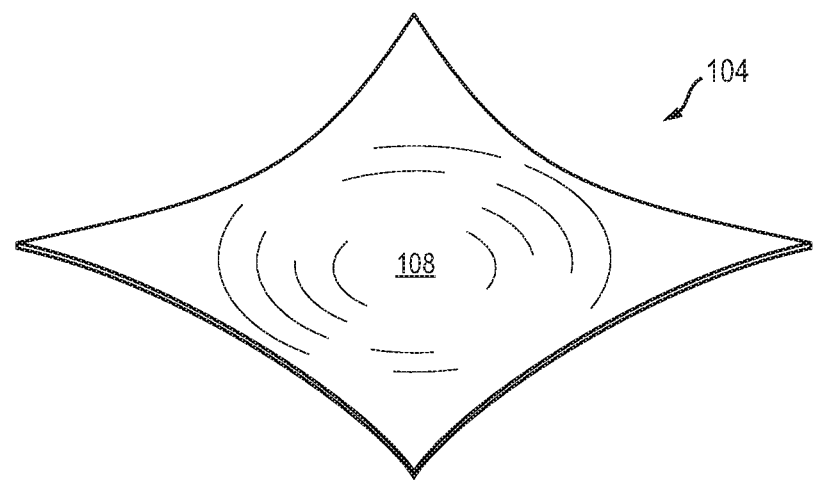
FIGS. 7a-7b illustrate the semiconductor die from the wafer of FIGS. 3a-3d with a curved or concave image sensor region robust against buckling.

FIG. 7a shows a prospective view of curved image sensor region 108 in non-rectangular semiconductor die 104. In particular, curved image sensor region 108 exhibits no buckling or at least is robust against buckling during or after the mold process of FIGS. 5a-5c and 6a-6c by nature of the non-rectangular form factor with non-linear side edges 150. The concave aspect of non-linear side edges 150 into image sensor region 108 eliminates base substrate material 102 between corners 152, as described in FIG. 4c. There is less base substrate material 102 subject to deformation in high stress concentration areas. In other words, non-rectangular semiconductor die 104 exhibits a better fit in concave recess 162 with less base substrate material 102 between corners 152. The non-rectangular semiconductor die 104 experiences less stress during formation of the curved image sensor region 108 in concave recess 162. Compressive stress concentration areas on curved image sensor region 108 are alleviated, which eliminates or reduces buckling during or after the mold process of FIGS. 5a-5c and 6a-6c. The curved image sensor region 118 in semiconductor die 114 eliminates or reduces buckling for the same reasons as described above.

Figure 7B:
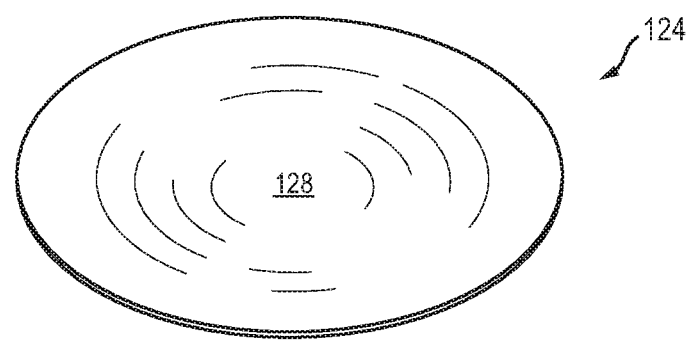

FIG. 7b shows a prospective view of curved image sensor region 128 in circular or elliptical semiconductor die 124. In particular, curved image sensor region 108 exhibits no buckling or at least is robust against buckling during or after the mold process of FIGS. 5a-5c and 6a-6c by nature of the circular or elliptical form factor with round side edge 156. The round side edge 156 eliminates base substrate material 122, as described in FIG. 4e. There is less base substrate material 122 subject to deformation in high stress concentration areas. In other words, circular or elliptical semiconductor die 124 exhibits a better fit in concave recess 162. The circular or elliptical semiconductor die 104 experiences less stress during formation of the curved image sensor region 108 in concave recess 162. Compressive stress concentration areas on curved image sensor region 108 are alleviated, which eliminates or reduces buckling during or after the mold process of FIGS. 5a-5c and 6a-6c. The curved image sensor region 138 in semiconductor die 134 eliminates or reduces buckling for the same reasons as described above.

Figure 8A:
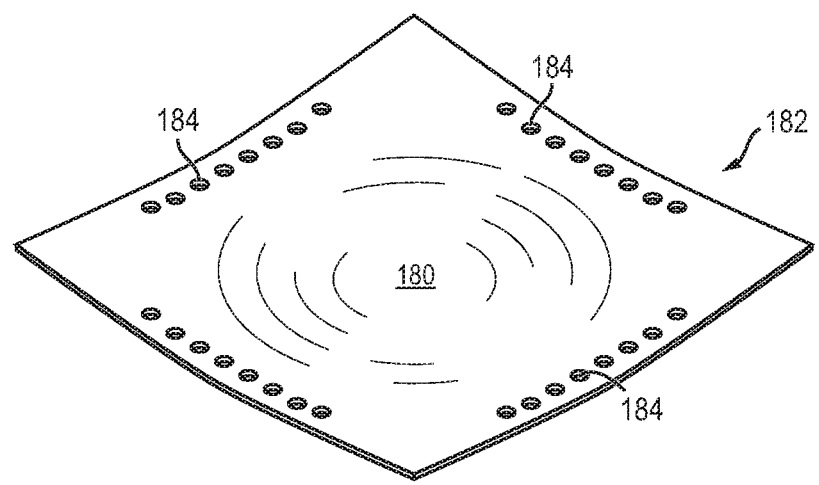
FIGS. 8a-8b illustrate a rectangular semiconductor die with a curved image sensor region and openings or perforations in a peripheral region of the die.

In another embodiment, FIG. 8a shows a prospective view of curved image sensor region 180 in rectangular semiconductor die 182. To reduce or eliminate buckling, a plurality of openings 184 is formed in high stress concentration areas, i.e., areas of greatest compressive stresses commonly subject to buckling, such as proximate to the outer side edge of image sensor region 180 or a peripheral region of semiconductor die 182. Openings 184 remove a portion of the base substrate material in a peripheral region of semiconductor die 182 to reduce compressive stress concentration areas on curved image sensor region 180. The amount of base substrate material removed by openings 180, as well as the shape and location of the openings, depend on base substrate material geometry and degree of bending. Openings 184 can also be formed in a non-rectangular semiconductor die e.g., 104, 114 to further reduce compressive stress concentration areas on curved image sensor region 108, 118.

Figure 8B:
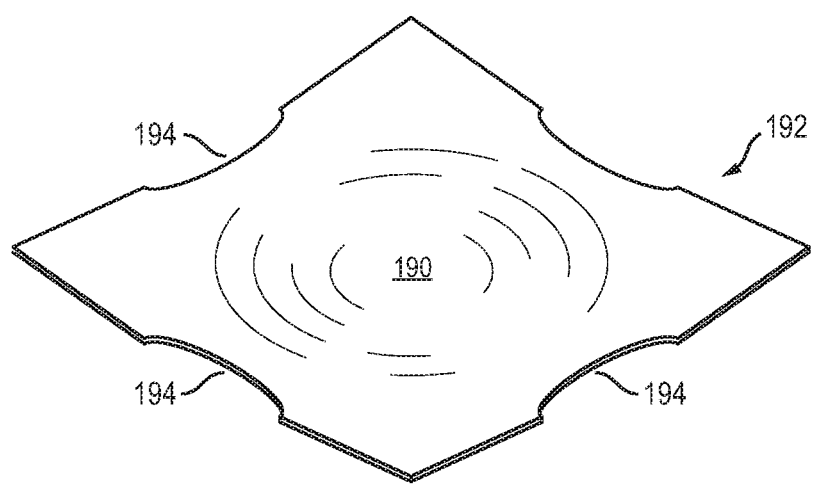

FIG. 8b shows a prospective view of curved image sensor region 190 in rectangular semiconductor die 192. To reduce or eliminate buckling, one or more perforation or cut-out 194 are formed in high stress concentration areas, i.e., areas of greatest compressive stresses commonly subject to buckling, such as proximate to the outer side edge of image sensor region 190 or in a peripheral region of semiconductor die 192. Perforation 194 remove a portion of the base substrate material in a peripheral region of semiconductor die 192 to reduce compressive stress concentration areas on curved image sensor region 190. The amount of base substrate material removed by perforation 194, as well as the shape and location of the perforation, depend on base substrate material geometry and degree of bending. Perforation 194 can also be formed in a non-rectangular semiconductor die e.g., rectangular or non-rectangular semiconductor die 104, 114 to further reduce compressive stress concentration areas on curved image sensor region 108, 118.

The non-rectangular semiconductor die 104 and 114 and circular or elliptical semiconductor die 124 and 134 provide form factors that remove base substrate material, found in rectangular semiconductor die, and avoid stress concentration areas. Likewise, openings 184 and perforations 194 reduce stress concentration areas that leads to buckling, warpage or cracking of the semiconductor die. Reducing stress concentration areas in image sensor regions 108, 118, 128, and 138 eliminates or reduces buckling, cracking, and instability during the manufacturing process and provides a more reliable curved image sensor semiconductor die.

The areas of removed base substrate material can be used a variety for of purposes, e.g., wirebond, additional circuitry, and addition structural elements for packaging, such as adhesives or standoff material. Non-active die areas can be used for alignment, calibration structures, or for additional die types. In particular, wafer area 116 in FIG. 3b or wafer area 126 in FIG. 3c can be used to form smaller semiconductor die of the same type or a different type as semiconductor die 114 or 124, thus increase usage of the semiconductor wafer area. For example, semiconductor die 114 can be a large image sensor die and semiconductor wafer area 116 can be a small image sensor die.

While one or more embodiments have been illustrated and described in detail, the skilled artisan will appreciate that modifications and adaptations to those embodiments may be made without departing from the scope of the present disclosure.

What is claimed:

1. A semiconductor die, comprising:
   a base substrate material including a side edge, wherein the side edge is non-linear, the base substrate material comprising a first side and a second side with a thickness between the first side and the second side, the base substrate material forming a surface;
   an opening or perforation formed through the thickness in the base substrate material adjacent to the side edge;
   wherein the surface of the base substrate material forms a curved surface out to the side edge.

2. The semiconductor die of claim 1, further including an image sensor region formed in the base substrate material.

3. The semiconductor die of claim 1, wherein the side edge is concave.

4. The semiconductor die of claim 1, wherein the side edge is convex.

5. The semiconductor die of claim 1, further including a substrate comprising a recess, wherein the curved surface extends in parallel with a surface of the substrate within the recess.

6. The semiconductor die of claim 5, wherein the semiconductor die contacts the curved surface for an entire width of the semiconductor die.

7. The semiconductor die of claim 5, further including an epoxy disposed between the base substrate material and the substrate.

8. A semiconductor die, comprising:
  a base substrate material including a side edge, the base substrate material comprising a first side and a second side with a thickness between the first side and the second side, the base substrate material forming a surface;
  a plurality of openings or perforations formed through the thickness of the base substrate material adjacent to the side edge;
  wherein the surface of the base substrate material forms a curved surface out to the side edge.

9. The semiconductor die of claim 8, further including an image sensor region formed in the base substrate material.

10. The semiconductor die of claim 8, wherein the side edge is concave.

11. The semiconductor die of claim 8, wherein the side edge is convex.

12. The semiconductor die of claim 8, further including a substrate comprising a recess, wherein the curved surface extends in parallel with a surface of the substrate within the recess.

13. The semiconductor die of claim 12, wherein the semiconductor die contacts the curved surface for an entire width of the semiconductor die.

14. The semiconductor die of claim 12, further including an epoxy disposed between the base substrate material and the substrate.

15. A semiconductor die, comprising:
  a base substrate material including four side edges, wherein each side edge of the four side edges is non-linear, the base substrate material comprising a first side and a second side with a thickness between the first side and the second side, the base substrate material forming a surface;
  wherein the surface of the base substrate material forms a curved surface out to each side edge.

16. The semiconductor device of claim 15, wherein the semiconductor die is non-rectangular.

17. The semiconductor device of claim 15, wherein the side edges are concave.

18. The semiconductor device of claim 15, wherein the non-rectangular semiconductor die includes a circular or elliptical shape.

19. The semiconductor device of claim 15, further including a plurality of openings or perforations formed in the semiconductor die.

20. The semiconductor device of claim 15, further including a substrate comprising a recess, wherein the semiconductor die extends into the recess.

* * * * *